(12) United States Patent
Alvité

(10) Patent No.: US 6,484,881 B1
(45) Date of Patent: Nov. 26, 2002

(54) ELECTRONIC COMPONENT PACKAGE FOR STANDARD AND ODD FORM COMPONENTS

(76) Inventor: Joseph G. Alvité, 353 Aspen Rd., Wyoming, MN (US) 55092

( * ) Notice: Subject to any disclaimer, the term of this patent is extended or adjusted under 35 U.S.C. 154(b) by 0 days.

(21) Appl. No.: 09/498,488

(22) Filed: Feb. 3, 2000

Related U.S. Application Data (60) Provisional application No. 60/118,845, filed on Feb. 5, 1999, and provisional application No. 60/149,644, filed on Aug. 18, 1999.

(51) Int. Cl.[7] .............................................. B65D 85/00
(52) U.S. Cl. ........................ 206/714; 206/722; 206/725
(58) Field of Search ................................ 206/713, 714, 206/716, 717, 722, 724, 725

(56) References Cited

U.S. PATENT DOCUMENTS

| | | | | |
|---|---|---|---|---|
| 3,465,874 A | * | 9/1969 | Hugle et al. ................. | 206/714 |
| 4,708,245 A | * | 11/1987 | Boeckmann et al. ......... | 206/714 |
| 4,733,778 A | * | 3/1988 | Boeckmann et al. ......... | 206/714 |
| 5,234,105 A | * | 8/1993 | Sato et al. ................... | 206/714 |
| 5,259,500 A | | 11/1993 | Alvité et al. | |
| 5,333,733 A | * | 8/1994 | Murata ........................ | 206/725 |
| 5,390,472 A | * | 2/1995 | Weiler et al. ................ | 53/412 |
| 5,562,384 A | | 10/1996 | Alvité et al. | |
| 5,727,305 A | | 3/1998 | Alvité et al. | |
| 5,733,093 A | | 3/1998 | Palm et al. | |
| 5,809,639 A | | 9/1998 | Alvité | |
| 5,810,170 A | | 9/1998 | Alvité | |
| 6,036,023 A | * | 3/2000 | Pfahnl et al. ................ | 206/725 |

FOREIGN PATENT DOCUMENTS

EP 0625301 B1 9/1996

* cited by examiner

*Primary Examiner*—Shian Luong
(74) *Attorney, Agent, or Firm*—Faegre & Benson, LLP (57) ABSTRACT

An electronic component package for containing a plurality of electronic components. The package including structure that provides at least two configurations. In the first configuration, the package functions as a sufficiently rigid tray for supporting and protecting the plurality of components during storage, shipping and handling of the package. In the second configuration, the package functions as a flexible carrier tape for feeding the components into and through automated component handling and placement equipment. The structure includes package edges interconnected to and extending along a plurality of tray sections in which the components are housed. In one embodiment, the package edges connect to a cover to provide the first rigid tray configuration. In another embodiment, the package edges include flexible edge wings that rotate into position and are secured to provide the first rigid tray configuration.

12 Claims, 12 Drawing Sheets

ELECTRONIC COMPONENT PACKAGE FOR STANDARD AND ODD FORM COMPONENTS

This application claims the benefit of the following two prior filed co-pending provisional applications: U.S. patent application Ser. No. 60/118,845, filed Feb. 5, 1999, entitled: STANDARD ODD FORM TRAY FOR ELECTRONIC COMPONENT PACKAGING; and U.S. patent application Ser. No. 60/149,644, filed Aug. 18, 1999, entitled: STANDARD ODD FORM TRAY (SOFT) WITH COVER.

FIELD OF THE INVENTION

This invention relates to packaging for electronic components, particularly to trays and tapes used for shipping, storage, automated feeding and pickup of electronic components.

BACKGROUND OF THE INVENTION

There are numerous packaging formats currently available for electronic surface mount and leaded components, such as connectors, transformers, speakers, and integrated circuits (IC's). These packaging formats include bulk packaging (placement in bags or bins), single or multi-lane tubes, paper tapes, standard EIA carrier pocket tapes, thermoformed trays, and injection molded trays (JEDEC standard, matrix trays, or gel packs). All of these current packaging methods have limitations relating to cost, usability with current automated loading, feeding or pick-and-place equipment, protection of the components, and/or lead time for adaptation to different component configurations. In addition, the ability to reuse and/or recycle the packaging are also issues of concern.

A need exists for electronic component packaging that: can be standardized; works with automated equipment that is available or easily modified; protects the components within the package during storage, shipping, and handling; and can be produced and used at a reasonable cost.

SUMMARY OF THE INVENTION

The present invention is an improved electronic component package. The package of the present invention, when in a first configuration, functions as a sufficiently rigid tray capable of supporting and protecting a plurality of electronic components housed within the package. With such rigid support, the electronic component package may be stacked, boxed, shipped, stored, transported and fed while still protecting the electronic components within compartments of the package. When in a second configuration, the package of the present invention functions as a flexible carrier tape capable of conforming to a radius when passed over a roller, such as a drive roller. With such flexibility, the package may be readily fed into and through automated component feeding and placement equipment.

The electronic component package includes a plurality of component-receiving tray sections having leading and trailing edges which are flexibly interconnected to one another. Each component-receiving tray section is open on a top side. Thus, the electronic component package functions as a flexible carrier tape that conforms to a radius when passed over a roller by flexing between the tray sections. The package also includes first and second package edges interconnected to and extending along the tray sections. The first and second package edges are removably connectable to a cover over the top side of the tray sections. The electronic component package is sufficiently rigid when covered to function as a tray that supports electronic components located within the plurality of component-receiving tray sections and protects the electronic components during handling and storage of the electronic component package. The first and second package edges include tape-to-tray structure that provide for the two configurations described above.

In one embodiment, the package edges cooperate with the cover to provide the first configuration of sufficient rigidity, and provide the second configuration of flexibility when not cooperating. In other embodiments, the package edges include flexible edge wings that rotate into position and are secured to provide the rigidity, but provide the flexibility when outwardly extended.

DETAILED DESCRIPTION OF THE INVENTION

Figure 1:
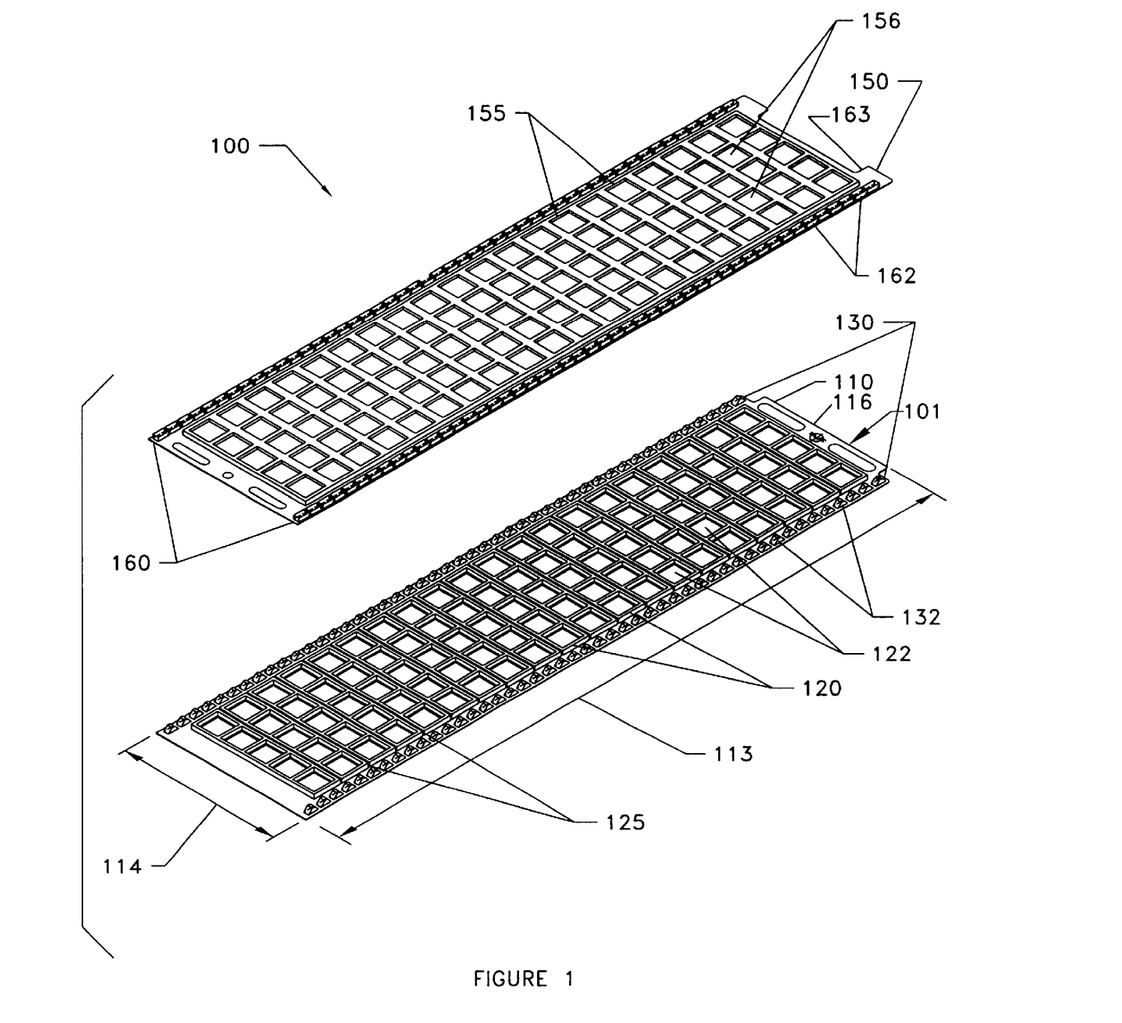
FIG. 1 is an exploded perspective view of an electronic component package in accordance with the present invention, including a cover that is removably connectable to a base.
Figure 2:
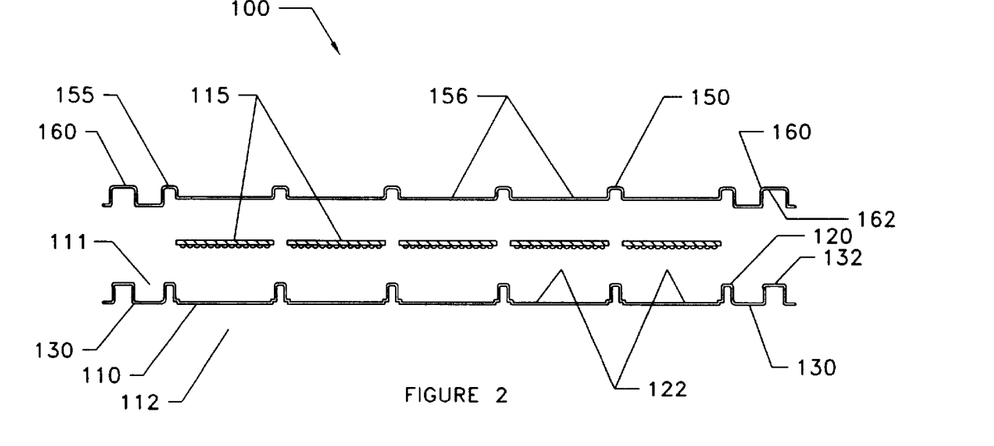
FIG. 2 is an exploded end view of the electronic component package of FIG. 1 with electronic components.
Figure 3:
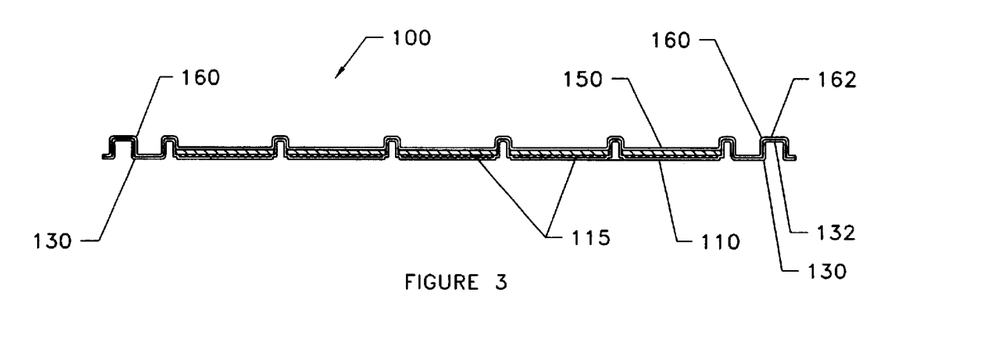
FIG. 3 is an end view of the electronic component package of FIG. 2 with the cover connected to the base.

With reference to the attached Figures, it is to be understood that like components are labeled with like numerals throughout the several Figures. An electronic component package 100 in accordance with the present invention is shown in FIGS. 1–3. In this embodiment, the electronic component package 100 includes a base 110 and a cover 150 that removably connects to the base 110. The base 110 includes a plurality of relatively rigid tray sections 120 configured to receive electronic components 115, such as integrated circuits, transformers, power supplies, or other types of components commonly placed onto printed circuit boards. The relatively rigid tray sections 120 are formed adjacent one another and are flexibly interconnected to one another at tray joints 125 along a length 113 of the base 110. The package 100 has a length 113 of about 600 millimeters (23.62 inches) in one embodiment, which allows for ergonomic manual handling of the package 100.

The cover 150 includes a corresponding plurality of cover sections 155 configured and positioned to mate with the tray sections 120 when the cover 150 is placed over and connected to the base 110. In this embodiment, the electronic components 115 are relatively thin and small, such that the tray sections 120 are divided into a plurality of individual tray section pockets 122, each open on a top side 111 and designed to hold a single component 115. The cover sections 155 are also configured to include a plurality of cover section pockets 156, each designed to mate with a single tray section pocket 122. The cover section pockets 156 extend somewhat inward toward the base 110 to provide a reasonably secure fit for the components 115 within the tray section pockets 122, as perhaps shown best in FIG. 3. Such a fit helps ensure that the components 115 do not experience excessive movement within the electronic component package 100 during storage, shipping or other handling, that could potentially cause damage to the components 115.

The electronic component package 100 of the present invention, can be adapted to accommodate the storage, handling and feeding needs of many types of electronic components, small to large, both standard and non-standard (commonly known as "odd form" components). In order to best accommodate a variety of components, the tray sections 120 may be configured in numerous ways. A tray section 120 may extend across substantially an entire width 114 of the base 110 as a single pocket, the sections 120 may be divided (as described above and shown in FIG. 1) into a plurality of equally sized pockets 122, or the tray sections 120 may be divided into varying size pockets (not shown), as needed. In addition, each tray section 120 may be configured the same as all other tray sections 120 within the electronic component package 100, or they may each be configured in a different manner, as needed. The cover 150 is then configured in a manner to correspond to the tray section configurations of the base 110 and characteristics of the intended electronic components. The width 114 of the package 100 can range from about 100 millimeters (3.94 inches) to about 200 millimeters (7.87 inches), but other widths are also contemplated.

Figure 4A:
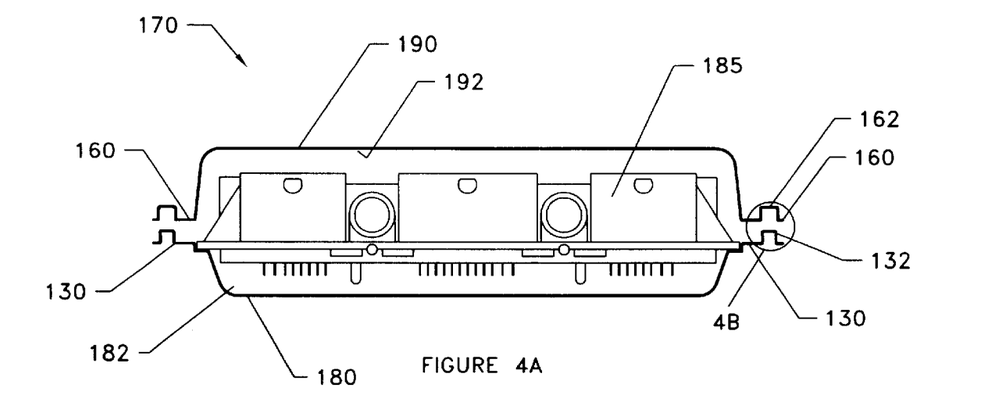
FIG. 4A is a partially exploded end view of a second embodiment of an electronic component package in accordance with the present invention, including a cover, a base and electronic components.
Figures 4B, 5:
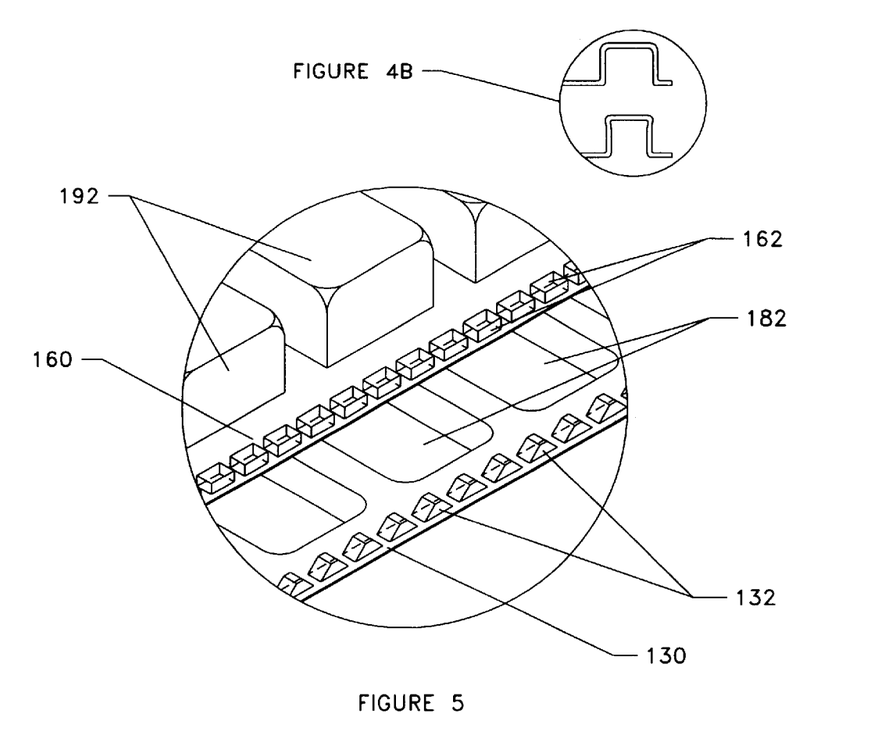
FIG. 4B is a detailed end view of edge connectors indicated by circle 4B of FIG. 4A.
FIG. 5 is an exploded detail view of one embodiment of edge connectors used to removably connect a cover to a base, as shown in FIGS. 1–4.

Referring now also to FIGS. 4A, 4B and 5, a second embodiment of an electronic component package 170 in which an elongated electronic component 185 resides in a tray section 182 formed as a single pocket within a base 180, is shown. A cover 190 includes a corresponding cover section 192 formed as a single pocket, as well. The cover section 192, in this embodiment, is configured to extend outward, away from the base 180, to accommodate the height of the electronic component 185.

The illustrated embodiments of bases 110, 180 include two package edges 130 that extend along the length 113 of the base 110, 180, adjacent to and interconnected with the tray sections 120, 182. Each package edge 130 includes a plurality of edge connectors 132 integrally formed within the edges 130. The covers 150, 190 have two corresponding cover edges 160 extending along the length, adjacent to and interconnected with the cover sections 155, 192. Each cover edge 160 includes a plurality of corresponding cover connectors 162 integrally formed therein. When the cover 150, 190 is placed over and connected to the base 110, 180, as illustrated for the first embodiment in FIG. 3, the edge connectors 132 mate with the cover connectors 162 to form a removable connection for holding the cover 150, 190 onto the base 110, 180.

Base 110 further includes a center tongue portion 116 that is interposed between the first and second package edges 130 at a leading edge 101 of the electronic package 100. The cover 150 includes a correspondingly sized and positioned cut-out portion 163 interposed between the cover edges 160, also at the leading edge 101 of package 100. When the cover 150 is received over the top side 111 of the base 110, the cut-out portion 163 overlies the center tongue portion 116.

As shown in detail in FIG. 5, the edge connectors 132 of these embodiments are each formed as a hollow frustum of a rectangular pyramid, open on a bottom side 112. These frustopyramidal edge connectors 132 are slightly larger at the tip than the base. The corresponding cover connectors 162 are each formed as hollow, relatively square prisms, also open on a bottom side 112. The cross-sections of these two types of connectors is shown in FIG. 4B. When the cover 150, 190 is connected to the base 110, 180, the frustopyramidal edge connectors 132 are inserted into the hollow prismatic cover connectors 162. The slightly larger tip of the edge connectors 132 is press-fit into the cover connector 162 resulting in a secure connection between the base 110, 180 and the cover 150, 190. When desired, the cover 150, 190 may be disengaged from the base 110, 180 by forcibly removing the edge connectors 132 from the cover connectors 162.

Besides facilitating connection to the cover 150, 190 the configuration of the edge connectors 132 facilitates transport of the electronic component package 100, 170 by a drive mechanism (not shown). Teeth or other structure of a drive mechanism may be inserted into the bottom-side opening of the frustopyramidal edge connectors 132 forming a rack-and-pinion type structure capable of moving the package 100, 170 along a pathway. As such, the configuration of the electronic component package 100, 170 facilitates use of the package 100, 170 with automatic feeding equipment. Thus, the edge connectors 132 serve the dual purpose of connecting the base 110, 180 to the cover 150, 190 and engaging a drive mechanism for feeding the package 100, 170 along a pathway.

The electronic component package 100, 170 of the present invention has at least two configurations designed to facilitate use of the package 100, 170 in the storage, handling and feeding of electronic components. In a first configuration, the electronic component package 100, 170 functions as a tray that is sufficiently rigid to support a plurality of electronic components 115, 185 residing in the tray sections 120, 182 of base 110, 180. With such rigid support, the electronic component package 100, 170 may be stacked, boxed, shipped, stored, transported and fed while still protecting the electronic components 115, 185 within the tray sections 120, 182.

Figure 6:
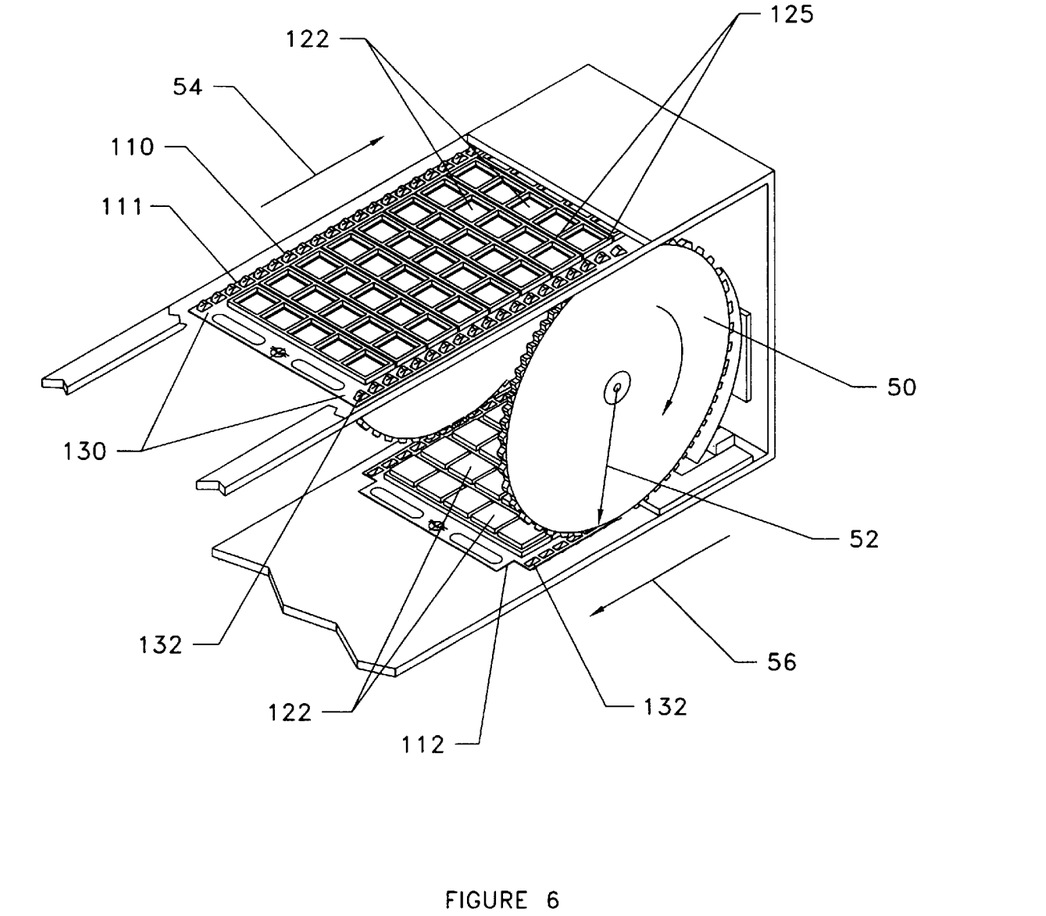
FIG. 6 is a perspective view of the electronic component package of FIG. 1 functioning in a second configuration as a flexible carrier tape as it passes over a roller.

Referring now to FIG. 6 in which the first embodiment is illustrated, in a second configuration, the electronic component package 100 functions as a flexible carrier tape that conforms to a radius 52 when the package 100 is passed over a roller 50 or other radiused member. As the package 100 passes over the roller 50, the base 110 flexes between the relatively rigid tray sections 120 at the tray joints 125, allowing the package 100 to conform to the radius 52. In this configuration, the package 100 may be fed along a feeding direction 54 into and through a feeder mechanism that indexes the tray sections 120 into position for automatic component removal by a pick-up mechanism, such as pick-and-place robotic equipment or other component process. The emptied tray sections 120 may then be rotated out of the way, as shown, and returned in a direction 56 relatively opposite to the feeding direction 54.

The first and second configurations of the electronic component package 100, 170 are achieved through tape-to-tray structure integrally formed, in the embodiments shown herein, within the package 100, 170. In the embodiments shown in FIGS. 1–5, this structure which cooperates to provide this function includes the package edges 130, the edge connectors 132 and the cover 150, 190 removably connectable to the base 110, 180 at the edge connectors 132 of the package edges 130. When the cover 150, 190 is attached to the base 110, 180, the electronic package 100, 170 is sufficiently rigid to support and protect the electronic components 115, 185 housed within the package 100, 170. When the cover 150, 190 is removed, the base 100, 170 is relatively flexible and able to relatively easily conform to a roller 50 for feeding or other purposes.

Figure 7:
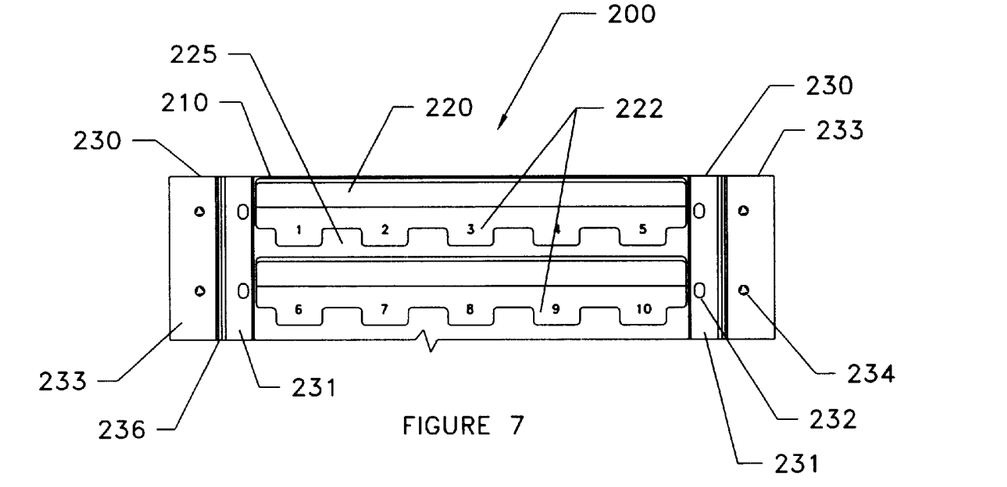
FIG. 7 is a top plan view of a third embodiment of a portion of an electronic component package in accordance with the present invention having flexible edge wings shown in a carrier tape configuration.
Figure 8:
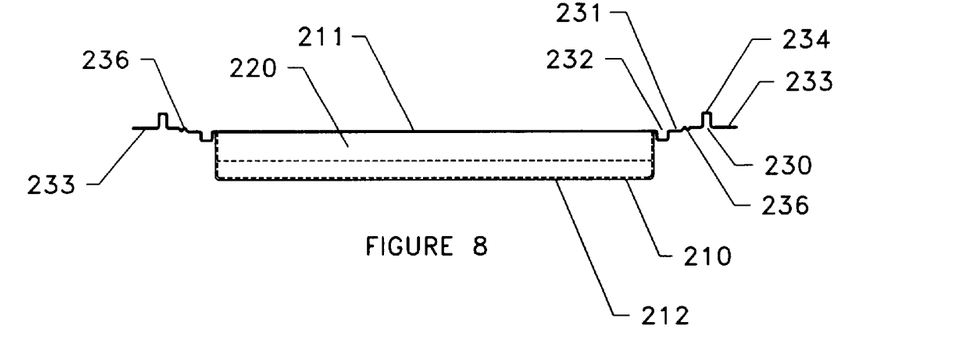
FIG. 8 is an end view of the electronic component package of FIG. 7.
Figure 9:
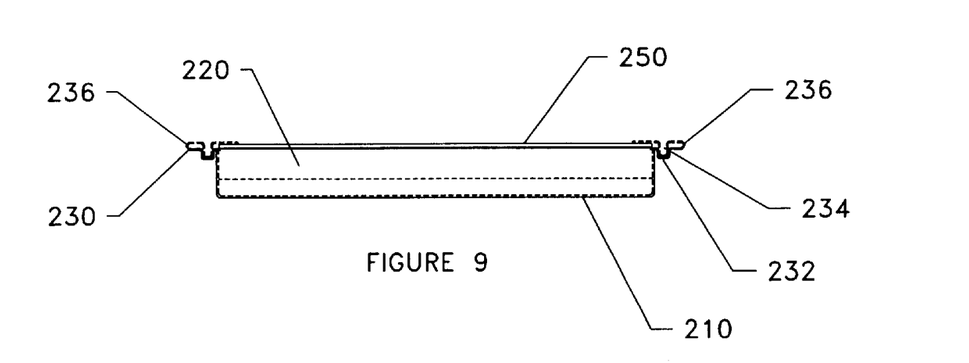
FIG. 9 is an end view of the electronic component package of FIGS. 7 and 8, shown in a first configuration functioning as a rigid tray with a cover.

Referring now to FIGS. 7–9, a third embodiment of the invention, an electronic component package 200, is shown having a base 210 and a cover 250. The base 210 includes a plurality of tray sections 220, of which only an end two are shown, formed adjacent and interconnected to each other at tray joints 225. Each tray section 220 is shown divided into pocket areas 222 that are numbered for control purposes. The base 210 also includes package edges 230 that extend along the base 210, adjacent to and interconnected with the tray sections 220.

Each package edge 230 includes an edge portion 231 directly adjacent the tray sections 220 and an edge wing 233 hingeably connected to the edge portion 231 at wing joint 236. In this embodiment, each package edge 230 also includes a plurality of edge connectors 232 integrally formed within the edge portions 231 and a plurality of corresponding wing connectors 234 integrally formed within the edge wings 233. Edge connectors 232 are formed as inset hollow oblong cylinders, open on a top side 211 and closed on a bottom side 212 in the configuration shown in FIGS. 7 and 8. The wing connectors 234 are formed as protruding hollow circular cylinders, open on the bottom side 212 and closed on the top side 211 in the configuration shown in FIGS. 7 and 8. Edge connectors 232 and wing connectors 234 are designed to releasably engage one another in a press-fit manner when the wing connectors 234 are inserted into the edge connectors 232.

In this embodiment, the electronic component package 200 is in a first configuration, functioning as a sufficiently rigid tray, when the edge wings 233 are rotated about 180 degrees upwardly toward the tray sections 220 about the wing joints 236, and the edge connectors 232 and wing connectors 234 are engaged, as shown in FIG. 9. The cover 250 may then be positioned on the top side 211 of the package 200 between the wing joints 236. In this configuration, the electronic component package 200 may be stacked, stored, shipped, fed or otherwise handled in a convenient manner with less effort and cost, all the while protecting the electronic components housed within the package.

Figure 10:
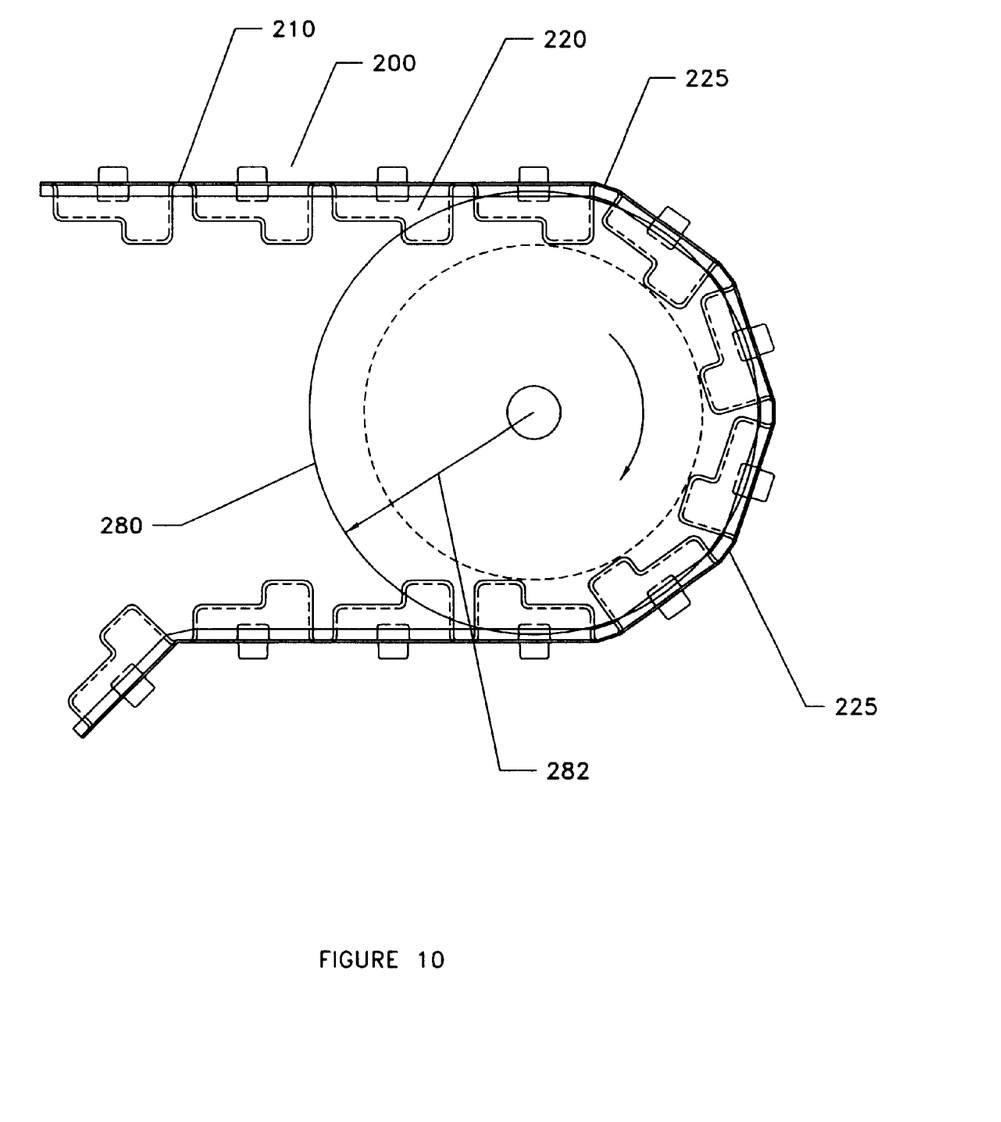
FIG. 10 is a side view of an electronic component package in accordance with the present invention shown in a second configuration passing over a roller.
Figure 11:
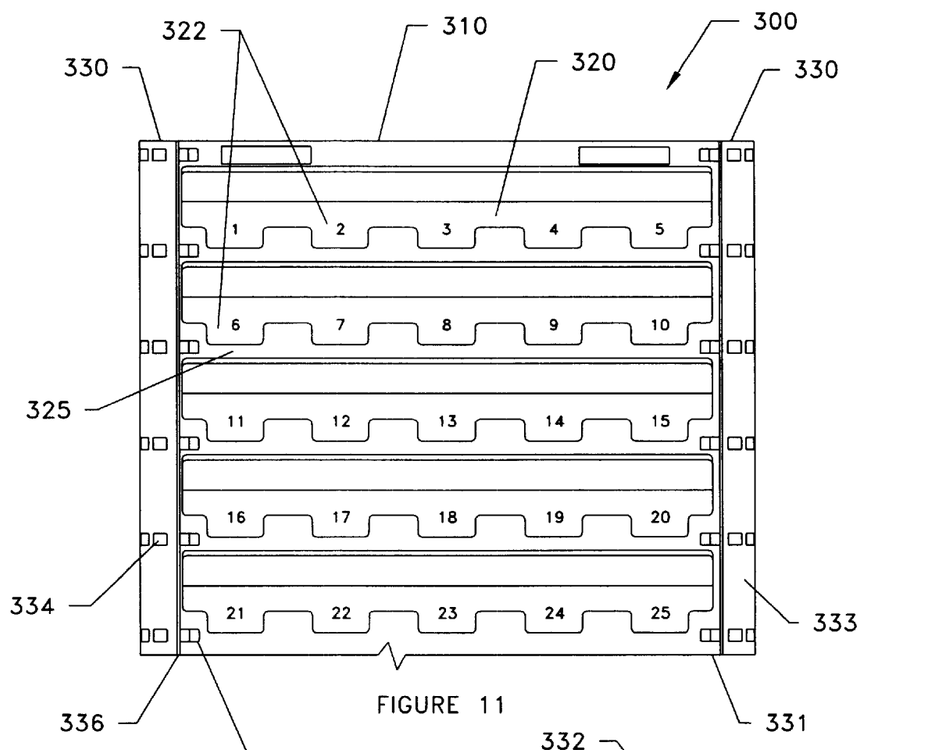
FIG. 11 is top plan view of a fourth embodiment of an electronic component package in accordance with the present invention having flexible edge wings shown in a carrier tap configuration.

The package 200 is in a second configuration, functioning as a relatively flexible carrier tape, when the edge wings 233 are in their outermost extended position, as shown in FIGS. 7 and 8. Referring now also to FIG. 10, as the package 200 passes over a roller 280, the base 210 flexes between the tray sections 220 at the tray joints 225, allowing the package 200 to conform to a radius 282. In this configuration, the wing connectors 234 may also facilitate transport of the electronic component package 200 by a drive mechanism, such as roller 280. Teeth or other structure (not shown) of drive mechanism 280 may be inserted into the bottom-side opening of the wing connectors 234, in a manner similar to that described above for the frustopyramidal edge connectors 132 of the first embodiment. As the roller 280 rotates, the package 200 is moved along a pathway.

Figure 12:
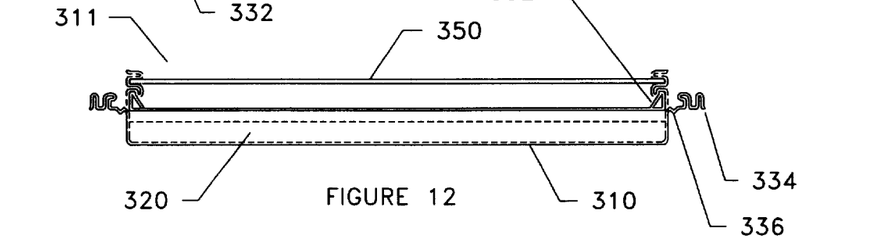
FIG. 12 is an end view of the electronic component package of FIG. 11, shown with the edge wings in both the carrier tape configuration and a tray configuration with a cover.
Figure 13:
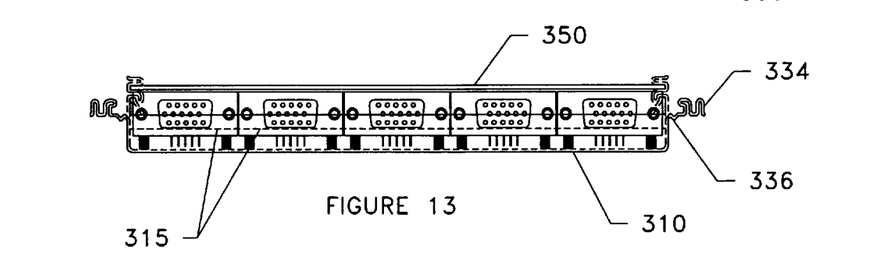
FIG. 13 is an end view of the electronic component package of FIG. 12 shown filled with electronic components.
Figure 14:
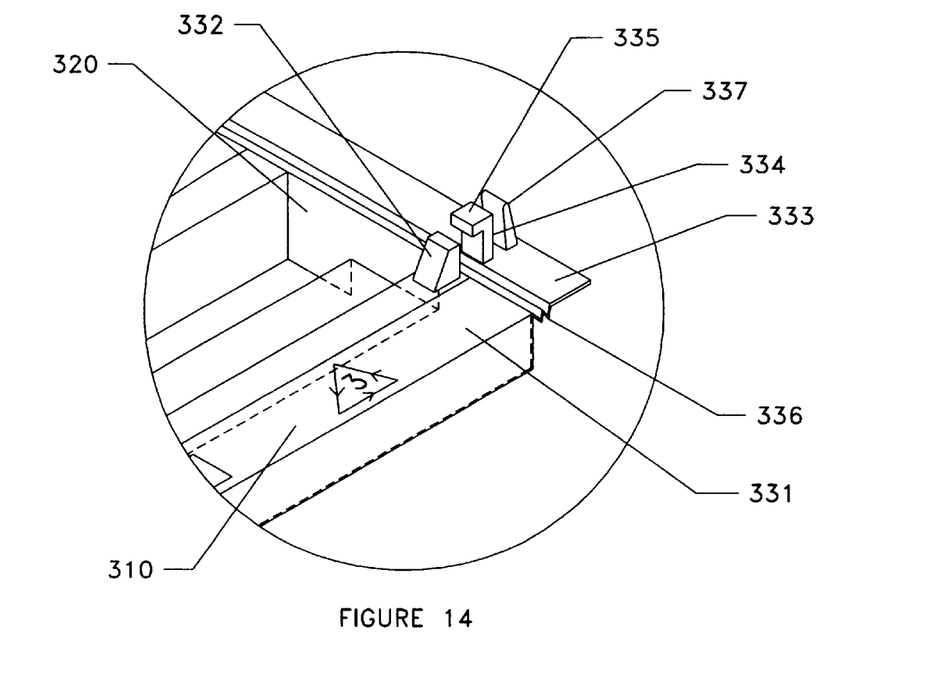
FIG. 14 is a detail perspective view of one embodiment of an edge wing and edge connect shown in a carrier tape configuration.

Referring now to FIGS. 11–15, a fourth embodiment of the present invention, an electronic component package 300, is shown having a base 310 and a cover 350. The base 310 includes a plurality of tray sections 320, formed adjacent and interconnected to each other at tray joints 325. Each tray section 320 is shown divided into pocket areas 322 that are numbered for control purposes and may be filled with electronic components 315, as shown in FIG. 13. The base 310 also includes package edges 330 that extend along the base 310, adjacent to and interconnected with the tray sections 320.

Each package edge 330 includes an edge portion 331 directly adjacent the tray sections 320 and an edge wing 333 hingeably connected to the edge portion 331 at wing joint 336. In this embodiment, each package edge 330 also includes a plurality of edge connectors 332 integrally formed within the edge portions 331 and a plurality of corresponding wing connectors 334 integrally formed within the edge wings 333. As shown in FIGS. 12 and 13 and similarly shown in detail in FIGS. 14 and 15, edge connectors 332 are formed as wedge-shaped protrusions on a top side 311 of package 300. The wing connectors 334 are formed in two parts: a relatively 'L' shaped hook portion 335 spaced from a protrusion 337. Edge connectors 332 and wing connectors 334 are designed to releasably engage one another when the hook portions 335 of the wing connectors 334 are moved over the wedge-shaped edge connectors 232.

Figure 15:
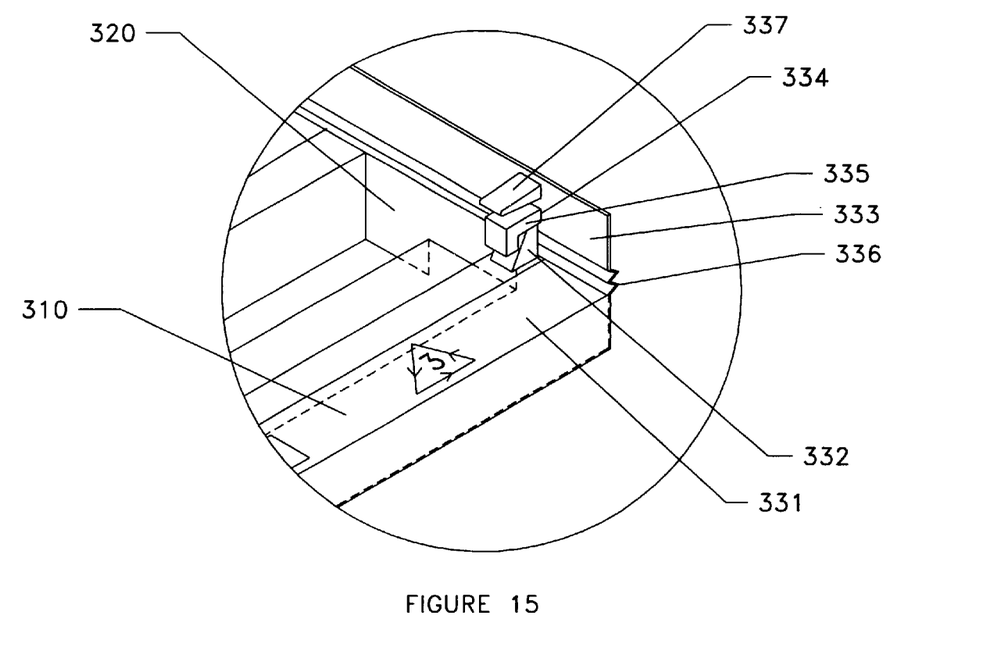
FIG. 15 is a detail perspective view of the embodiment of the edge connector of FIG. 14 shown in a tray configuration.

In this embodiment, the electronic component package 300 is in a first configuration, functioning as a sufficiently rigid tray, when the edge wings 333 are rotated about 90 degrees upwardly toward the tray sections 320 about the wing joints 336, and the edge connectors 332 and wing connectors 334 are engaged, as shown in FIGS. 12, 13 and 15. The cover 350 may then be positioned on the top side 311 of the package 300, inserted between the hook portions 335 and the protrusions 337. In this configuration, the electronic component package 200 may be stacked, stored, shipped, fed or otherwise handled in a convenient manner with less effort and cost, all the while protecting the electronic components housed within the package.

The package 300 is in a second configuration, functioning as a relatively flexible carrier tape, when the edge wings 333 are in their outermost extended position, as shown in FIGS. 11–14. In a manner similar to the previously described embodiment, the package 300 may pass over a roller (such as roller 280) while the base 310 flexes between the tray sections 320 at the tray joints 325, allowing the package 300 to conform to a radius of the roller (such as radius 282).

Figure 16:
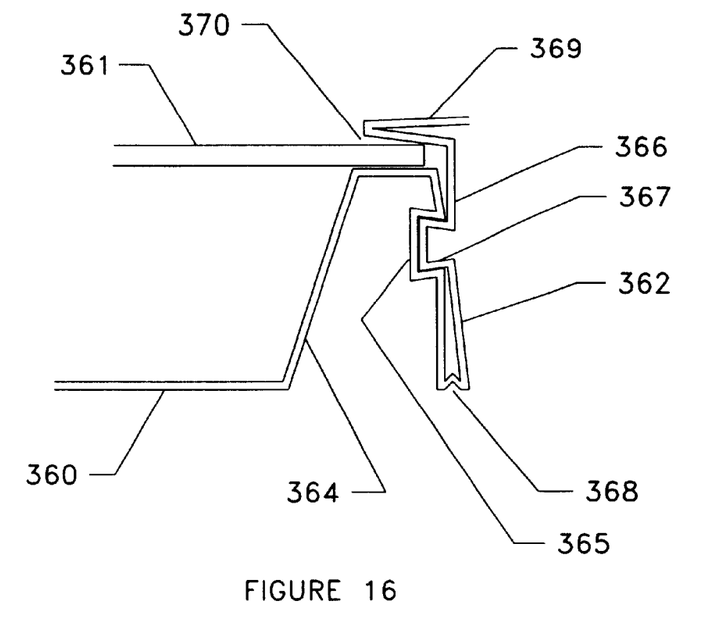
FIG. 16 is a detail perspective view of another embodiment of an edge wing and edge connector shown in a tray configuration with a cover.

Referring now to FIG. 16, another embodiment of a package edge 362 integrally formed in a base 360 is shown having an edge portion 364 and an edge wing 366. The edge portion 364 is formed as a raised member having a plurality of trapezoidal openings 365 formed toward the edge wing 366. The edge wing 366 is flexibly connected to the edge portion 364 at wing joint 368. The edge wing 366 includes a plurality of corresponding trapezoidal protrusions 367 formed for insertion into the openings 365 of the edge portion 364. In the same manner as the embodiment described above, the electronic component package 300 is in the second configuration, functioning as a flexible carrier tape, when the edge wings 366 are in a flat, outwardly extending position (not shown). The electronic component package 300 is in the first configuration when the edge wings 366 are rotated about 90 degrees upward, toward the tray sections (not shown), and the protrusions 367 engage the openings 365, as shown. In this configuration, an extension 369 on the edge wing 366 forms a gap 370 between the edge portion 364 and the extension 369. A cover 361 may be inserted into this gap 370 for protection of any electrical components housed within the base 360.

Figure 17:
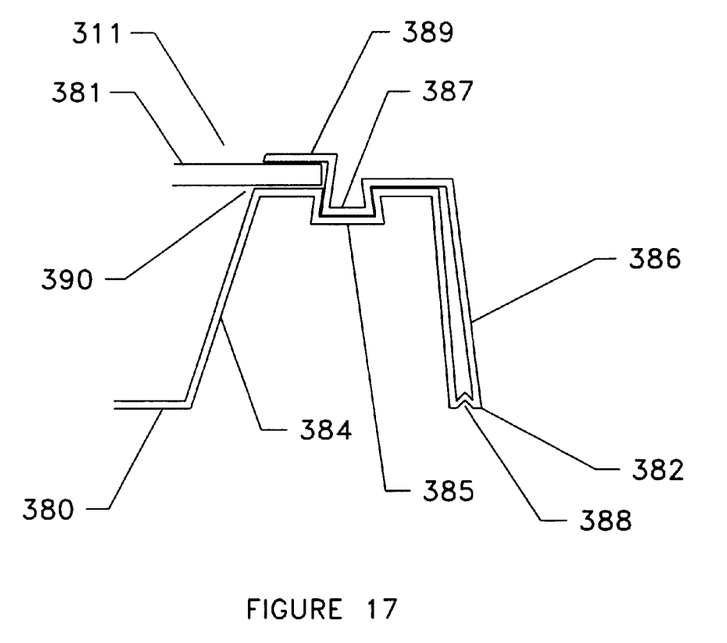
FIG. 17 is a detail perspective view of yet another embodiment of an edge wing and edge connector shown in a tray configuration with a cover.

Referring now to FIG. 17, yet another embodiment of a package edge 382 integrally formed in a base 380 is shown having an edge portion 384 and an edge wing 386. In this embodiment, the edge portion 384 is also formed as a raised member having a plurality of trapezoidal openings 385, but these openings are formed on the top side 311 of the package 300. The edge wing 386 is flexibly connected to the edge portion 384 at wing joint 388. The edge wing 386 includes a plurality of corresponding trapezoidal protrusions 387 formed for insertion into the openings 385 of the edge portion 384. In the same manner as the embodiment described above, the electronic component package 300 is in the second configuration, functioning as a flexible carrier tape, when the edge wings 386 are in a flat, outwardly extending position (not shown). The electronic component package 300 is in the first configuration when the edge wings 386 are rotated about 90 degrees upward, toward the tray sections (not shown), and the protrusions 387 engage the openings 385, as shown. In this configuration, an extension 389 on the edge wing 386 forms a gap 390 between the edge portion 384 and the extension 389. A cover 381 may be inserted into this gap 390 for protection of any electrical components housed within the base 380.

In both of the above described embodiments shown in FIGS. 16 and 17, the edge portions 364, 384 may be raised above a top surface of the tray sections (not shown) a sufficient height, such that a cover 361, 381 inserted in the gaps 370, 390 clears electrical components that protrude above the tray section top surface. Alternately, the edge portions 364, 384 maybe raised to the top surface of the tray sections, such that a cover 361, 381 inserted in the gaps 370, 390 just covers the tray sections without any height clearance.

Referring now to FIGS. 18–21, a fifth embodiment of the present invention, an electronic component package 400, is shown having a base 410 and a cover 450. The base 410 includes a plurality of tray sections 420 formed adjacent and interconnected to each other at tray joints 425. In this embodiment, each tray section 420 is a single unit designed for housing an elongated individual electronic component 415. The base 410 also includes package edges 430 that extend along the base 410, adjacent to and interconnected with the tray sections 420.

Figure 18:
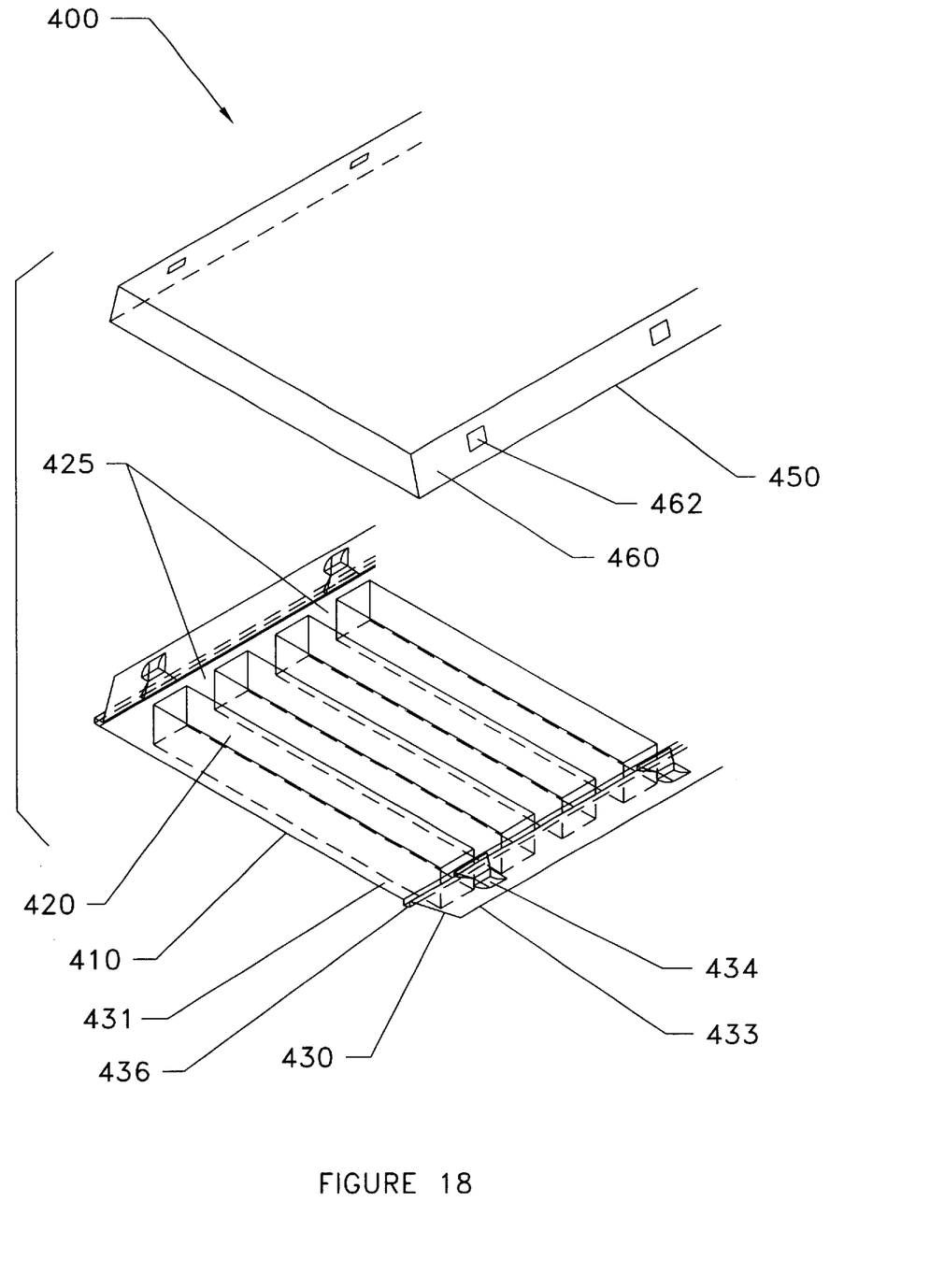
FIG. 18 is an exploded perspective view of a fifth embodiment of an electronic component package in accordance with the present invention having edge wings and a cover, one edge wing shown in carrier tape configuration and the other edge wing shown in tray configuration.

Each package edge 430 includes an edge portion 431 directly adjacent the tray sections 420 and an edge wing 433 hingeably connected to the edge portion 431 at wing joint 436. In this embodiment, each package edge 430 includes a plurality of wing connectors 434 integrally formed within the edge wings 433. The wing connectors 434 are formed as hollow wedge-shaped protrusions having substantially convex outer surfaces extending downward toward a bottom side 412 of the base 410. The cover 450 is formed as a generally trapezoidal domed lid having outwardly angled cover edges 460. Formed within the cover edges 460 are a plurality of openings 462 corresponding to the wing connectors 434 on the base 410.

Figure 19:
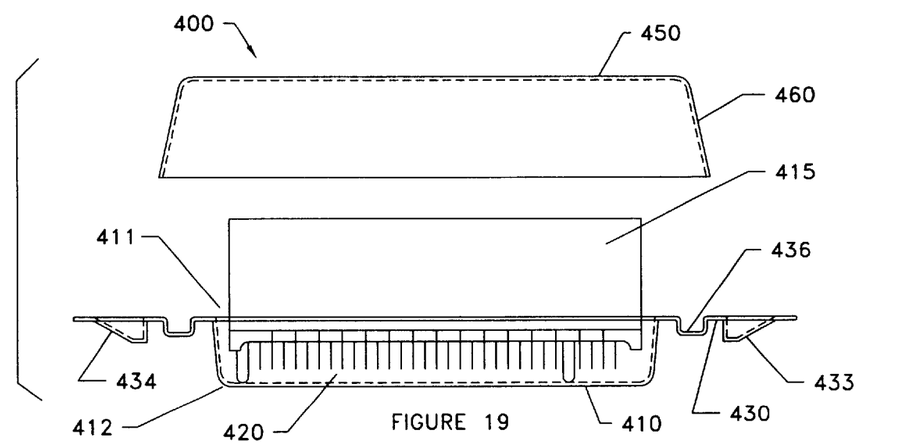
FIG. 19 is an end view of the electronic component package shown in FIG. 18 with both edge wings in carrier tape configuration.

In this embodiment, the electronic component package 400 is in a second configuration, functioning as a relatively flexible carrier tape, when the edge wings 433 are in their outermost extended position, as shown in FIGS. 18 and 19. When the package 400 passes over a roller (not shown but similar to FIG. 10), the base 410 flexes between the tray sections 420 at the tray joints 425, allowing the package 400 to conform to a radius of the roller.

Figure 20:
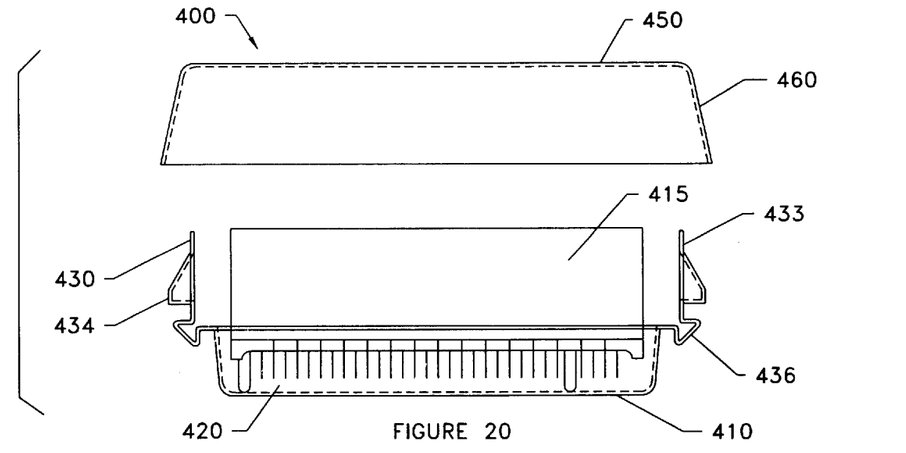
FIG. 20 is an end view of the electronic component package shown in FIG. 18 with both edge wings in a tray configuration.
Figure 21:
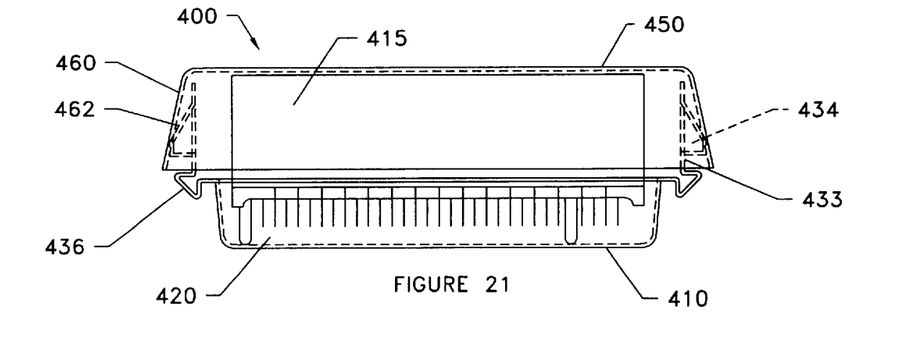
FIG. 21 an end view of the electronic component package shown in FIG. 20 with the cover connected to the edge wings.

The electronic component package 400 transforms into a first configuration, functioning as a sufficiently rigid tray, when the edge wings 433 are rotated about 90 degrees upward toward the tray sections 420 about the wing joints 436 and the wing connectors 434 engage the openings 462 of the cover 450. This transformation is shown in FIGS. 19 to 21. The cover 450 is then secured to the base 410 and the package 400 may be stacked, stored, shipped, fed or otherwise handled in a convenient manner with less effort and cost, all the while protecting the electronic components housed within the package. As shown clearly in FIG. 19, the electronic components 415 protrude above the tray sections 420 but are sufficiently encased within the package 400 by the domed cover 450 in combination with the edge wings 433.

As indicated by the various embodiments described above, numerous variations of electronic component packages having package edges, edge connectors, edge wings, and/or covers with or without cover connectors are possible. All such variations are within the scope and spirit of the present invention.

The electronic component package of the present invention is preferably thermoformed or vacuum formed. Thermoforming or vacuum forming of the packages provides a low cost manufacturing process that can be very responsive to changing needs or new designs within the industry. The package is preferably formed from a polymer material. Such materials may include, but are not limited to, high impact styrene and PETG copolyesters. These materials may be used in varying thicknesses, and may include additives for anti-static, conductivity or other preferred characteristics. The material chosen should be non-contaminating, clean, clear, tough and safe for the electronic conductors housed within the package. The covers may be made out of the same material as the bases, or in some embodiments may be made from cardboard or other readily available material. These materials allow the packages to be reused multiple times and recycled when no longer usable, thereby saving on waste and the costs associated with such waste.

The electronic component package of the present invention facilitates handling and feeding of the plurality of electronic component housed within the package by functioning as a sufficiently rigid tray in one configuration and as a flexible carrier tape in another configuration. Such capability allows the package to be used in automated handling, feeding and placement equipment used for placement of the electronic components into printed circuit boards, or other suitable locations.

Figure 22:
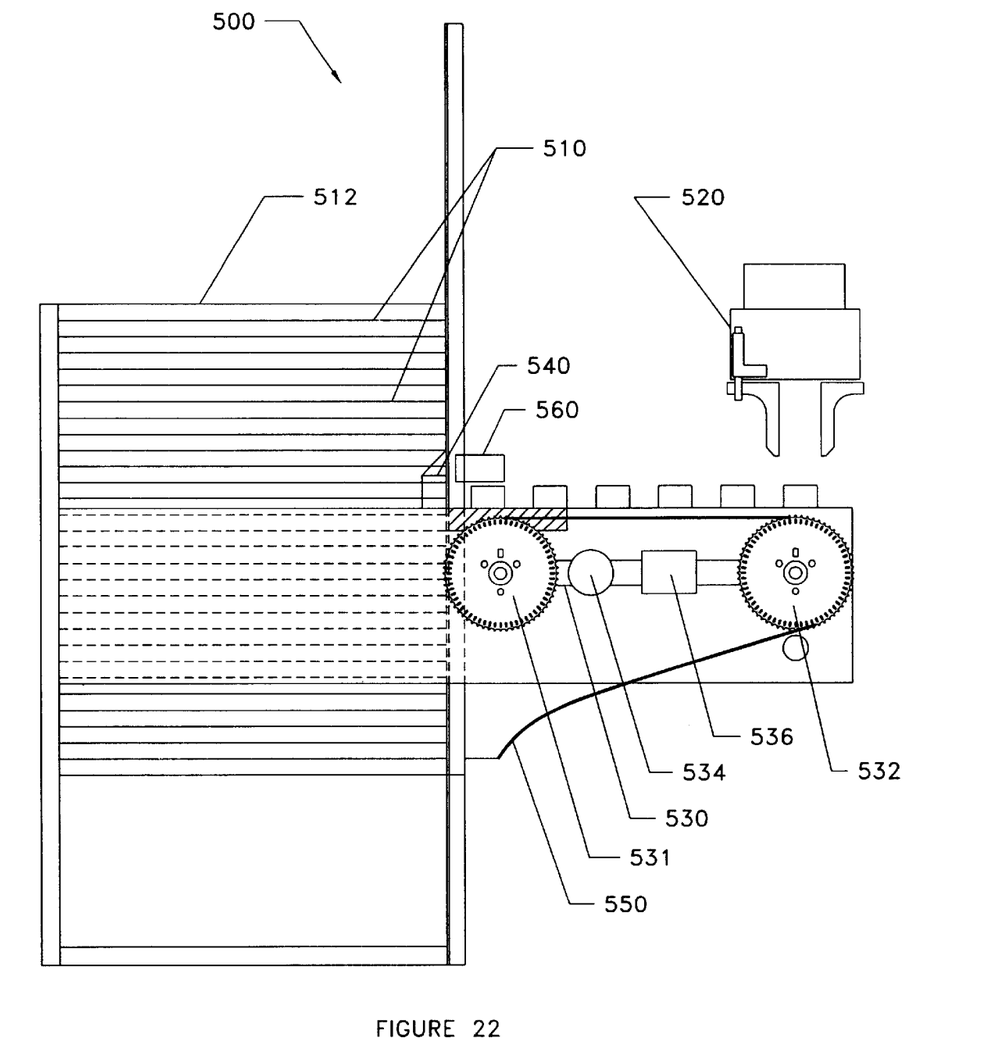
FIG. 22 is a diagram of a feeder mechanism for feeding electronic component packages of the present invention to a component pickup location.

Referring now to FIG. 22, an electronic component feeder 500 is shown having a plurality of electronic component packages 510 in a stack 512, positioned for feeding toward a component placement mechanism 520. A drive mechanism 530 includes a pair of rollers 531, 532 driven by a motor 534 and controlled by a controller 536. Each package 510 is indexed out of the stack 512 by the drive mechanism 530 and moved along a pathway toward the placement mechanism 520. The feeder 500 also includes a scanner 560, or other sensor used to monitor the packages 510 as they exit the stack 512. The packages 510 may include bar codes or other coding to indicate type, quantity, location, or other data or characteristics of the electronic components housed within the package.

Alternately, the packages 510 may be stored in an elevator having individual floors or shelves for each package 510. Such an elevator would index up or down in order to present the next package 510 to the feeder system.

An opening mechanism 540 positioned adjacent the stack 512 facilitates transformation of the packages 510 from the first configuration, wherein the package 510 functions as a sufficiently rigid tray, to the second configuration, wherein the package 510 functions as a flexible carrier tape. In some embodiments of the package 510, this opening mechanism 540 may move the edge wings of the base of the package 510 outward, disengaging wing connectors from edge connectors. In other embodiments of the package 510, this opening mechanism 540 may remove the cover from the base of the package 510. In yet other embodiments of the package 510, this opening mechanism 540 may perform any necessary activity to provide the transformation from the first to the second configuration of that particular package 510.

While in the second configuration, the package 510 is moved to a position under the placement mechanism 520 so that the placement mechanism 520 may remove the electronic components housed within the package. In addition, other processes may also take place at this position. The drive mechanism 530 then rotates the empty portion of the flexible package 510 out of the way about roller 532. As the entire package 510 becomes empty the package 510 is disposed of beneath the feeder mechanism 500 at a disposal site 550. These empty packages 510 may then be collected and reused, being filled again with a plurality of electronic components, as needed. When a package 510 becomes worn out or otherwise unusable, the package 510 may be recycled in an appropriate manner, thereby eliminating the waste commonly attributable to standard carrier tapes. By wrapping around the roller 532 and disposing of the package 510 beneath the feeder 500, the overall length of the equipment is reduced, thus saving space and therefore costs.

The electronic component package of the present invention provides a new hybrid type of package capable of performing both as a rigid tray and as a flexible carrier tape. This package allows for standardization of component packages that may be used with automated feeding and placement equipment within the electronic component industry. Within the standard sized package, the components may be housed in compartments of various sizes and shapes, as needed to meet the particular needs of those components. Such component may themselves be of standard size and shape, or they may be considered odd form components whose size and shape vary significantly. Such varying needs may be easily accommodated in the design and manufacture of the electronic component package of the present invention. Standardization of the package also allows for consistent component pick-up locations for various types of components.

The ability to function in a rigid tray mode provides an easily handled package during storage, shipping, filling or other handling of the packages and components, and provides physical protection for the components housed within the package during such handling. The ability to function in a flexible carrier tape mode provides an easily manipulated package during feeding and automated emptying of the package or other procedures performed on the components.

The electronic component packages may be provided with machine or manually scannable coding that provides information on the contents of the packages, thus improving the efficiency of handling the components within an automated environment, as well as a storage or shipping environment. The use of clear materials helps facilitate location and identification of components within the package.

Although the present invention has been described with reference to preferred embodiments, workers skilled in the art will recognize that changes may be made in form and detail without departing from the spirit and scope of the invention. In addition, the invention is not to be taken as limited to all of the details thereof as modifications and variations thereof may be made without departing from the spirit or scope of the invention.

What is claimed is:

1. An electronic component package comprising:
 a plurality of component-receiving tray sections having leading and trailing edges which are flexibly interconnected to one another, each component-receiving tray section open on a top side, such that the electronic component package functions as a flexible carrier tape in one of two configurations; and
 first and second package edges interconnected to and extending along the tray sections, the first and second package edges removably connected to a cover received over the top side of the tray sections in the other of the two configurations,
 wherein the electronic component package is sufficiently rigid when covered to function as a tray that supports electronic components located within the plurality of component-receiving tray sections and protects the electronic components during handling and storage of the electronic component package, and wherein the first and second package edges of the tray sections include a plurality of edge connectors integrally formed within the edges and open on a bottom side thereof to engage a drive mechanism for feeding the electronic component package along a pathway.

2. The electronic component package of claim 1, wherein the first and second package edges comprise tape-to-tray structure that has first and second configurations, wherein the first configuration the electronic component package functions as a sufficiently rigid tray and the second configuration the electronic component package functions as a flexible carrier tape.

3. The electronic component package of claim 2, wherein the cover comprises a plurality of generally hollow cover connectors integrally formed in first and second cover edges for removable mating with the plurality of edge connectors, and wherein the tape-to-tray structure and the cover in the first configuration substantially increases the rigidity of the structure over the second configuration.

4. The electronic component package of claim 3, wherein the cover connectors that removably mate with the edge connectors of the first and second package edges are open on a bottom side thereof.

5. The electronic component package of claim 1, wherein the edge connectors of the tray sections each comprise a male locking member integrally formed toward the top side of the electronic component package within the first and second package edges, respectively, and a plurality of corresponding cover connectors comprise female locking members formed in the cover to receive the male locking members of the edge connectors of the tray sections.

6. The electronic component package of claim 1, wherein the tray sections and the first and second package edges are integral polymer members.

7. The electronic component package of claim 1, further comprising a leading edge configured for efficient removal of the cover by manual and automatic methods, with the leading edge comprising a center tongue portion interposed between the first and second package edges and interconnected to the tray sections, and a center cut-out portion interposed between the cover edges, the center cut-out sized and located to overlie the center tongue portion when the cover is received over the top side of the tray sections.

8. An electronic component package comprising:

a plurality of component-receiving tray sections which are flexibly interconnected to one another; and mode transforming structure for causing the electronic component package to function in one of at least two modes, in a first mode the electronic component package functions as a sufficiently rigid tray that supports electronic components located within the plurality of component-receiving tray sections and protects the electronic components during handling, shipping and storage of the electronic component package, and in a second mode the electronic component package functions as a flexible carrier tape that flexes relatively easily at the flexible interconnections between the plurality of component-receiving tray sections, such that the electronic component package conforms to a radius of a roller when passed over the roller, wherein the electronic component package includes a plurality of edge connectors integrally formed within the edges, each open on a bottom side thereof to engage a drive mechanism for feeding the electronic component package along a pathway.

9. An article package comprising:

a plurality of article-receiving tray sections having leading and trailing edges which are flexibly interconnected to one another, each article-receiving tray section open on a top side, such that the article package functions as a flexible carrier tape that conforms to a radius of a roller when passed over the roller; and first and second package edges interconnected to and extending along the tray sections, the first and second package edges removably connectable to a cover over the top side of the tray sections, wherein the first and second package edges each include a plurality of connectors open on a bottom side thereof to engage a drive mechanism for feeding the electronic component package along a pathway, such that the package is sufficiently rigid when covered to function as a tray that supports articles located within the plurality of article-receiving tray sections and protects the articles during handling and storage of the article package.

10. The electronic component package of claim 9, further comprising a leading edge configured for efficient removal of the cover by manual and automatic methods, with the leading edge comprising a center tongue portion interposed between the first and second package edges and interconnected to the tray sections, and a center cut-out portion interposed between the cover edges, the center cut-out sized and located to overlie the center tongue portion when the cover is received over the top side of the tray sections.

11. The electronic component package of claim 1, wherein the plurality of edge connectors are each formed as a hollow frustrum of a rectangular pyramid.

12. The electronic component package of claim 11, wherein the cover comprises a plurality of generally hollow cover connectors integrally formed in first and second cover edges and wherein the frustopyramidal edge connectors are slightly larger at a tip than at a base of the rectangular pyramid for secure engagement when inserted tip first into the generally hollow cover connectors.

* * * * *